United States Patent
Park et al.

(10) Patent No.: US 7,807,087 B2
(45) Date of Patent: Oct. 5, 2010

(54) IMPRINTING APPARATUS AND METHOD FOR FORMING RESIDUAL FILM ON A SUBSTRATE

(75) Inventors: Dae Jin Park, Incheon (KR); Kyu Young Kim, Suwon-si (KR); Jung Mok Bae, Seoul (KR); Ju Han Bae, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 135 days.

(21) Appl. No.: 11/882,363

(22) Filed: Aug. 1, 2007

(65) Prior Publication Data

US 2008/0028958 A1 Feb. 7, 2008

(30) Foreign Application Priority Data

Aug. 1, 2006 (KR) .................. 10-2006-0072612
Jan. 5, 2007 (KR) .................. 10-2007-0001522

(51) Int. Cl.
| | | |
|---|---|---|
| B28B 3/00 | (2006.01) | |
| B28B 3/02 | (2006.01) | |
| B28B 1/14 | (2006.01) | |
| B28B 1/02 | (2006.01) | |
| B28B 3/06 | (2006.01) | |
| B28B 5/00 | (2006.01) | |
| B29C 43/02 | (2006.01) | |
| B29C 43/32 | (2006.01) | |
| B29C 51/00 | (2006.01) | |
| B29C 39/00 | (2006.01) | |
| B29C 41/00 | (2006.01) | |
| B29C 71/00 | (2006.01) | |
| B29C 45/73 | (2006.01) | |
| B29C 59/02 | (2006.01) | |
| B29C 41/46 | (2006.01) | |
| B27N 3/18 | (2006.01) | |

(52) U.S. Cl. ............ 264/319; 264/299; 264/310; 264/236; 264/327; 264/297.4; 264/320

(58) Field of Classification Search ........... 264/319, 264/299, 310, 236, 327, 297.4, 320
See application file for complete search history.

(56) References Cited

U.S. PATENT DOCUMENTS 7,348,300 B2 * 3/2008 Lassila et al. ............... 510/175

(Continued)

FOREIGN PATENT DOCUMENTS

GB 2357731 7/2001

(Continued)

*Primary Examiner*—Khanh Nguyen
*Assistant Examiner*—Matthew Hoover
(74) *Attorney, Agent, or Firm*—Cantor Colburn LLP

(57) ABSTRACT

An imprinting apparatus and a method of the same which form a residual film including a uniform thickness all over a substrate. The imprinting apparatus includes a substrate support which supports a substrate which is coated with an imprint resin on an upper surface thereof, an imprint mold arranged on an upper side of the substrate support and which forms a predetermined pattern by molding the imprint resin coated on the substrate, a pressure roller which pressurizes the imprint mold to adhere closely to the substrate, a pressure roller control unit which controls the pressure roller to change a moving velocity and an applied pressure of the pressure roller according to a position of the imprint mold, and a resin curing unit which cures the imprint resin on the substrate.

9 Claims, 15 Drawing Sheets

U.S. PATENT DOCUMENTS

| | | | |
|---|---|---|---|
| 2001/0038910 A1* | 11/2001 | MacQueen et al. | 428/327 |
| 2002/0093901 A1* | 7/2002 | Davies et al. | 369/109.01 |
| 2002/0140886 A1* | 10/2002 | Sugiura et al. | 349/113 |
| 2004/0090610 A1 | 5/2004 | Hatakeyama et al. | |
| 2006/0133766 A1* | 6/2006 | Shelnut et al. | 385/147 |

FOREIGN PATENT DOCUMENTS

| | | | |
|---|---|---|---|
| JP | 7266538 | | 10/1995 |
| JP | 07266538 A | * | 10/1995 |
| JP | 7266539 | | 10/1995 |
| JP | 7266540 | | 10/1995 |
| JP | 07266540 A | * | 10/1995 |
| JP | 8240802 | | 9/1996 |
| JP | 2005196168 | | 7/2005 |
| KR | 1020000005898 | | 1/2000 |
| KR | 1020050117831 | | 12/2005 |
| WO | 03095175 | | 11/2003 |

\* cited by examiner

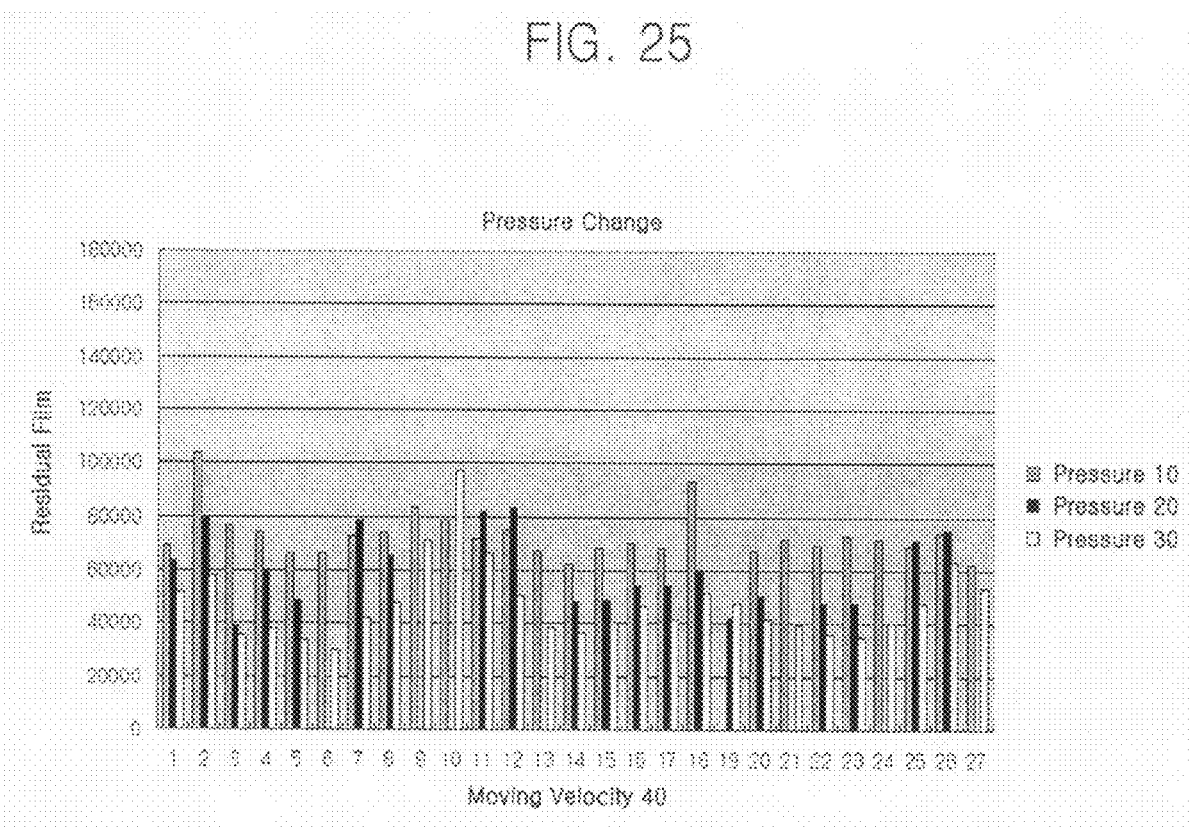

IMPRINTING APPARATUS AND METHOD FOR FORMING RESIDUAL FILM ON A SUBSTRATE

This application claims priority to Korean Patent Application Nos. 10-2006-0072612 filed on Aug. 1, 2006, and 10-2007-0001522 filed on Jan. 5, 2007, all the benefits accruing therefrom under the entire contents of which are incorporated by reference.

BACKGROUND OF THE INVENTION

1. Field of the Invention

The present invention relates to an imprinting apparatus and method and, more particularly, to an imprinting apparatus and method for forming a residual film including a uniform thickness all over a substrate.

2. Description of the Related Art

Display devices such as liquid crystal displays ("LCDs") and organic light emitting displays ("OLEDs") realize display performance with excellent image quality and operating speed by individually controlling pixels arranged in a matrix form. For example, the LCD controls the light transmittance of liquid crystal cells, arranged in the matrix form, in accordance with input image signal information, and therefore, displays a desired image. These display devices are flat panel display devices which are thin in thickness, light in weight and low in power consumption and driving voltage and thereby widely applied to various types of electronic devices.

These display devices mainly use a thin film transistor ("TFT") as a switching element. In the TFT manufacturing process, a photolithography method is performed several times to form a fine pattern. The photolithography method includes a film forming operation, a photoresist forming operation, a mask making operation, an exposing operation, a developing operation, an etching operation and a photoresist removing operation. Accordingly, the photolithography method requires a lot of manufacturing costs and time and the method itself is very complicated.

Therefore, various methods for forming a fine pattern on a substrate without employing the photolithography process have been proposed, for example, a nano-imprinting method.

In an imprinting method, a residual film is generated on a substrate after forming a pattern in terms of process characteristics. The residual film is removed by an etching operation to perform subsequent operations. In this case, when the thickness of the residual film on the substrate is not uniform, a portion of residual film remains on the substrate even after performing a residual film removal operation, and acts as an obstacle for the subsequent operations and further acts as a factor which deteriorates the display quality after the completion of the manufacturing process.

Accordingly, it is necessary to provide a method of forming a uniform residual film all over the substrate during the imprinting operation.

BRIEF SUMMARY OF THE INVENTION

Aspects of the present invention provide an imprinting apparatus and method for forming a residual film including a uniform thickness all over a substrate by changing a moving velocity and an applied pressure of a pressure roller during an operation of pressurizing an imprint mold.

In an exemplary embodiment, the present invention provides an imprinting apparatus which includes a substrate support on which supports a substrate which is coated with an imprint resin on an upper surface thereof, an imprint mold arranged on an upper side of the substrate support which forms a predetermined pattern by molding the imprint resin coated on the substrate, a pressure roller which pressurizes the imprint mold to adhere closely to the substrate, a pressure roller control unit which controls the pressure roller to change a moving velocity and an applied pressure of the pressure roller according to a position of the imprint mold, and a resin curing unit which cures the imprint resin on the substrate.

In an exemplary embodiment, the moving velocity of the pressure roller is reduced from a pressure-starting point of the imprint mold to a pressure-ending point.

In an exemplary embodiment, the applied pressure of the pressure roller is increased from the pressure-starting point of the imprint mold to the pressure-ending point.

In another exemplary embodiment, the present invention provides an imprinting method which includes coating an imprint resin on a substrate, aligning an imprint mold on the imprint resin, pressurizing the imprint mold by changing a moving velocity and an applied pressure of a pressure roller according to a position of the imprint mold, and curing the imprint resin.

In an exemplary embodiment, pressurizing the imprint mold includes pressurizing the imprint mold by reducing the moving velocity of the pressure roller as the pressure roller goes from a pressure-starting point to a pressure-ending point.

In another exemplary embodiment, pressurizing the imprint mold further includes pressurizing the imprint mold by increasing the applied pressure of the pressure roller as the pressure roller goes from the pressure-starting point to the pressure-ending point.

BRIEF DESCRIPTION OF THE DRAWINGS

The above and/or other aspects, features and advantages of the present invention will become more apparent from the following detailed description when taken in conjunction with the accompanying drawings, in which:

FIGS. 2A through 6A are perspective views showing an exemplary embodiment of operations of an imprinting method in accordance with the present invention.

FIGS. 11 through 25 are graphs showing measurement results of experimental examples 1 through 6 according to an exemplary embodiment of the present invention.

DETAILED DESCRIPTION OF THE INVENTION

Figure 1:
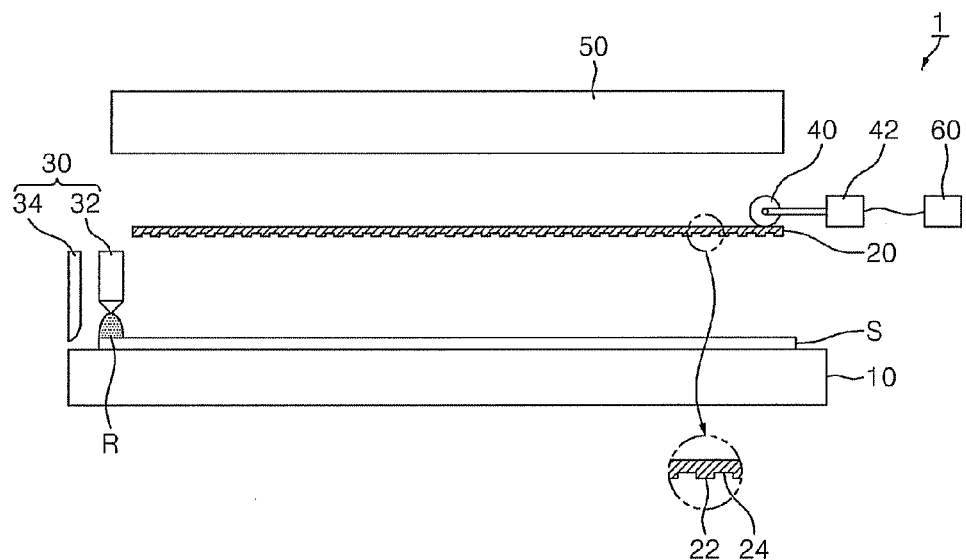
FIG. 1 is a front view showing an exemplary embodiment of an imprinting apparatus in accordance with the present invention.

The invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "lower" other elements or features would then be oriented "above" or "upper" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

FIG. 1 is a front view showing an exemplary embodiment of an imprinting apparatus in accordance with the present invention.

As shown in FIG. 1, an imprinting apparatus 1 in accordance with an exemplary embodiment of the present invention includes a substrate support 10, an imprint mold 20, a resin coating unit 30, a pressure roller 40, an ultraviolet ray irradiating unit 50 (i.e., the resin curing unit), for example, an ultraviolet lamp and a pressure roller control unit 60.

The substrate support 10 is an element on which a substrate S is mounted. According to an exemplary embodiment, the substrate support 10 may further include a substrate fixing unit (not shown) which fixes the mounted substrate S. The substrate fixing unit fixes the substrate S not to be moved during an imprinting method.

According to an exemplary embodiment, the resin coating unit 30 coats an imprint resin R on the substrate S. The resin coating unit 30 may be arranged on an upper side of the substrate support 10 or provided separately. An example of the resin coating unit 30 is shown in FIG. 1, in which the resin coating unit 30 includes a resin dispensing portion 32 which dispenses a predetermined amount of the imprint resin R on the substrate S and a resin squeezing portion 34 which squeezes the imprint resin R dispensed on the substrate S in a uniform thickness all over the substrate S.

The imprint mold 20 then pressurizes the imprint resin R dispensed on the substrate S to form a predetermined pattern. Accordingly, the imprint mold 20 includes a plurality of convex parts 22 and a plurality of concave parts 24 to form a predetermined pattern on the imprint resin R by pressurizing the imprint mold 20.

According to an exemplary embodiment, the imprint mold 20 may further include a mold transfer unit (not shown) which transfers a position of the mold. The mold transfer unit transfers the position of the imprint mold 20 to align the position of the imprint mold 20 with respect to the substrate S and separates the imprint mold 20 from the substrate S after the completion of the curing operation of the imprint resin R. According to an exemplary embodiment, in order to bring the imprint mold 20 into contact with the substrate S, the imprint mold 20 may be tilted to connect one side of the imprint mold 20 to the substrate S while not bringing the other side thereof into contact with the substrate S.

The pressure roller 40 pressurizes the imprint mold 20 to adhere closely to the substrate S. As described above, since the imprint mold 20 includes the convex parts 22 and the concave parts 24, when the imprint mold 20 adheres closely to the substrate S on which the imprint resin R is dispensed, the imprint resin R is filled in the concave parts 24 and removed between the convex parts 22 and the substrate S, to thereby form a predetermined pattern on the substrate S.

According to an exemplary embodiment, the pressure roller 40 may further include a roller transfer unit 42 which transfers the pressure roller 40 in a horizontal direction. The roller transfer unit 42 transfers the pressure roller 40 horizontally from one side of the imprint mold 20 to the other side thereof during the operation of pressurizing the imprint mold 20. Accordingly, in the imprinting apparatus 1 in accordance with an exemplary embodiment of the present invention, the imprint mold 20 is not pressurized at one time, but instead pressurized sequentially according to the transfer of the pressure roller 40.

The pressure roller control unit 60 controls the horizontal moving velocity of the pressure roller 40 and the pressure which the pressure roller 40 applies to the imprint mold 20. Since the horizontal moving velocity and the pressure of the pressure roller 40 have a great effect on the uniformity of the residual film remaining after the imprinting method has been performed, they should be controlled very precisely. In the current exemplary embodiment, the pressure roller control unit 60 controls the moving velocity and the pressure freely according to the transferred areas of the pressure roller 40. Moreover, the pressure roller control unit 60 is input with optimal control data for maintaining the uniformity of the residual film and thereby controls the pressure roller 40 precisely.

Next, an imprinting method in accordance with an exemplary embodiment of the present invention will now be described with reference to FIGS. 2A through 6A and FIGS. 2B through 6B. FIGS. 2A through 6A are perspective views showing an exemplary showing an exemplary embodiment of the operations of an imprinting method in accordance with the present invention; FIGS. 2B through 6B are cross-sectional views taken along line I-I' of FIGS. 2A through 6A.

Figure 2A:
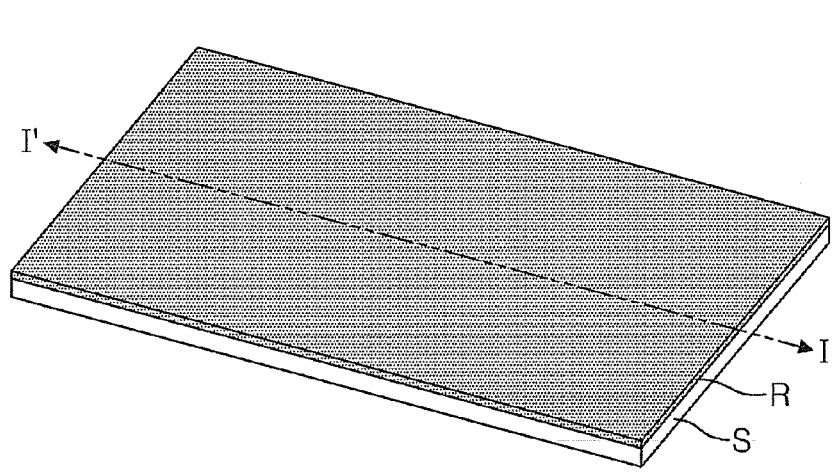
Figure 2B:
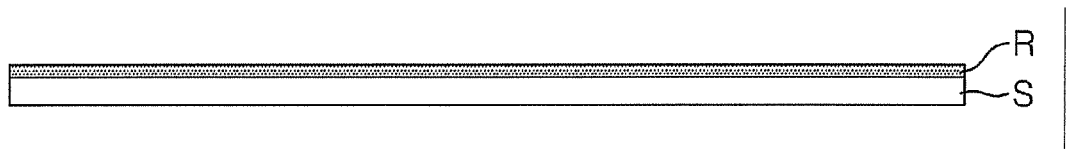
FIGS. 2B though 6B are cross-sectional view taken along line I-I' of FIGS. 2A through 6A.

As shown in FIGS. 2A and 2B, an imprint resin film R is formed with a predetermined thickness on the substrate S. According to an exemplary embodiment, the imprint resin R may be an ultraviolet ray curing resin or a thermosetting resin. The imprint resin R may be formed on the substrate S including a predetermined thickness by a coating method including spin coating, slit coating, dispensing, and the like.

When forming the imprint resin film R on the substrate S, it is necessary to regulate the amount of the imprint resin R coated on the overall substrate to the extent that the imprint resin R is filled in the concave parts 24 and remains in the convex parts 22. When the imprint resin R is filled in the concave parts 24 of the imprint mold 20 and not filled in the convex parts 22 in the imprinting process, an accurate pattern is not obtained. Accordingly, it is necessary to regulate the amount of the imprint resin R to fill the concave parts 24 of the imprint mold 20 sufficiently in order to form an accurate pattern.

Figure 3A:
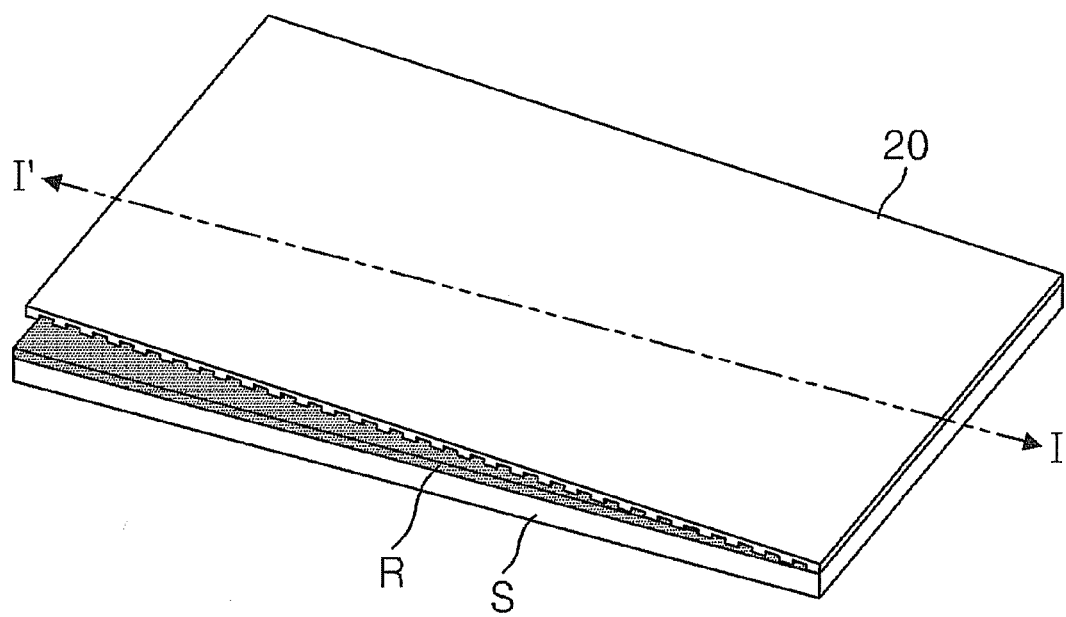
Figure 3B:
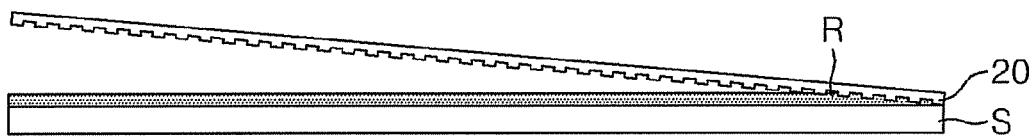

As shown in FIGS. 3A and 3B, the imprint mold 20 is aligned on the substrate S on which the imprint resin R is coated. In the current exemplary embodiment, the imprint mold 20 may comprise either a high-hardness imprint mold or a low-hardness imprint mold. When the high-harness imprint mold is employed, it is easy to control the residual film remaining on the substrate S after the imprinting method. However, there is a problem in that the pressure applied to the imprint mold 20 becomes large during the imprinting method. Therefore, according to an exemplary embodiment, the high-harness imprint mold may be used when the imprint resin pattern is cured by a thermosetting method. When employing the low-hardness imprint mold, the pressure applied to the imprint mold 20 in the imprinting process becomes small. However, there is a problem in that the thickness of the residual film is changed according to the position of the substrate S. Therefore, according to an exemplary embodiment, the low-harness imprint mold may be used when the imprint resin pattern is cured by an ultraviolet ray curing method.

Meanwhile, as shown in FIGS. 3A and 3B, according to an exemplary embodiment, when aligning the imprint mold 20, it is possible to tilt the imprint mold 20 and then to bring one side of the imprint mold 20 into contact with the substrate S.

Figure 4A:
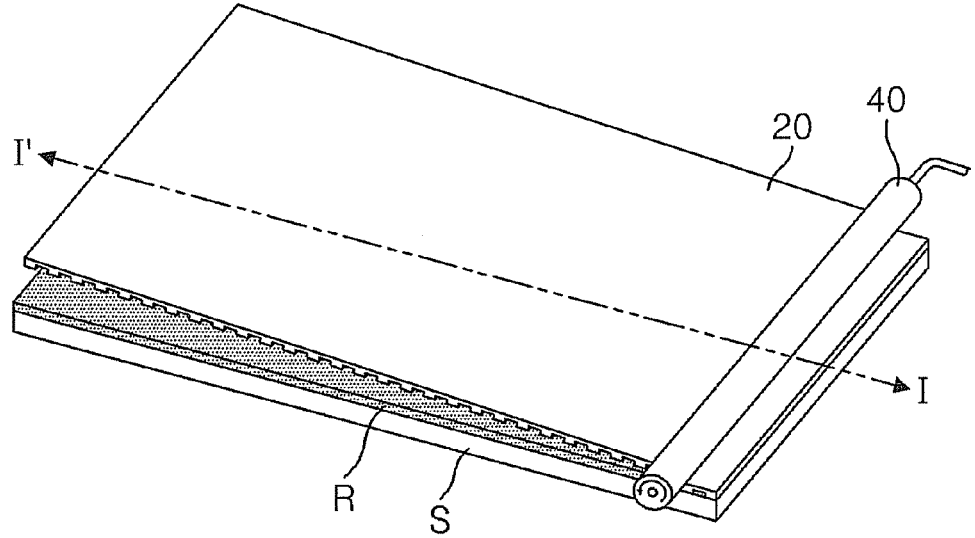
Figure 4B:
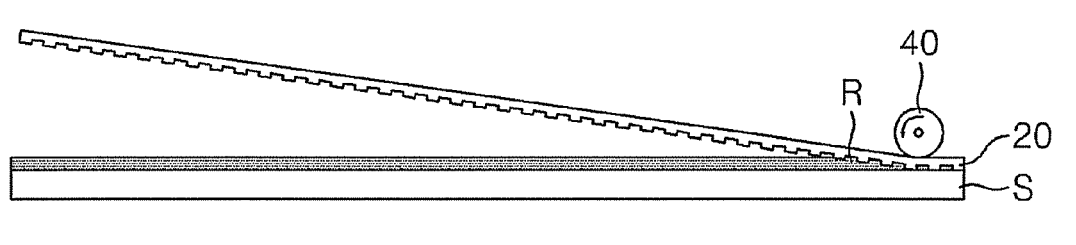

Next, as shown in FIGS. 4A and 4B, the imprint mold 20 aligned on the substrate S is pressurized using the pressure roller 40. Since the pressure roller 40 can pressurize a portion of the imprint mold 20 at a time, the pressure roller 40 pressurizes the imprint mold 20 while moving from one side of the imprint mold 20 to the other side thereof. During this operation, control of the moving velocity of the pressure roller 40 and the pressure applied to the imprint mold 20 are very important in ensuring the uniformity of the residual film.

Figure 5A:
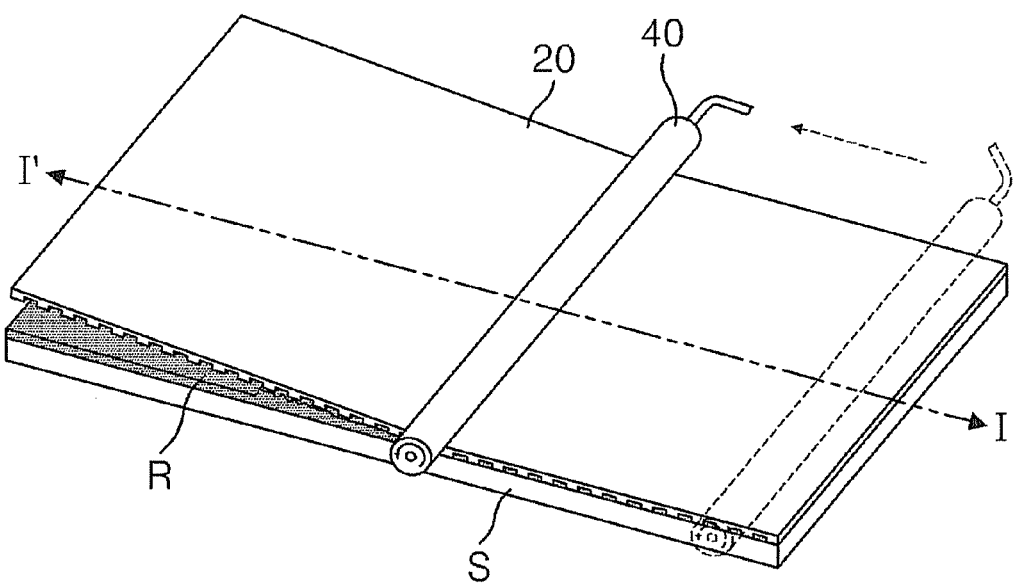
Figure 5B:
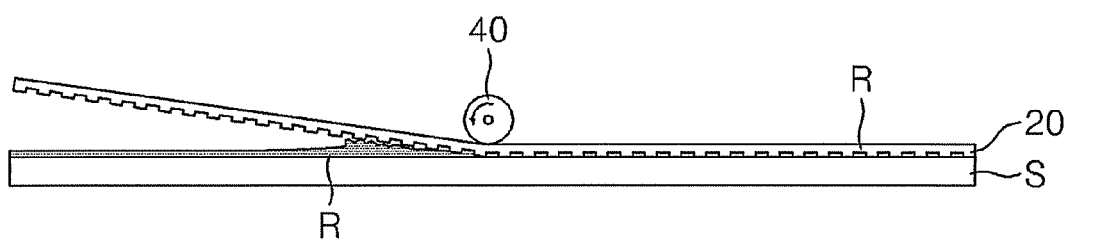

According to an exemplary embodiment, the portion of the imprint mold 20 coming in contact with the substrate S is first pressurized and then the pressure roller 40 moves in an opposite direction to sequentially pressurize the imprint mold 20 as shown in FIGS. 5A and 5B. When the imprint mold 20 is sequentially pressurized as described above, the imprint resin R squeezed by the sequentially moving pressure roller 40 is gathered on the substrate S as shown in FIGS. 5A and 5B. Accordingly, it is necessary to change the pressure applied to the imprint mold 20 from a pressure-starting point to a pressure-ending point.

When the imprint mold 20 is pressurized at a same velocity and pressure, the thickness of the residual film becomes larger as it goes to the pressure-ending point.

Accordingly, methods of changing the moving velocity and pressure of the pressure roller 40, according to exemplary embodiments of the present invention, prevent the thickness of the residual film from being changed according to the position of the substrate by changing the moving velocity and pressure of the pressure roller 40, in order to obtain a uniform thickness of the residual film.

Figure 7:
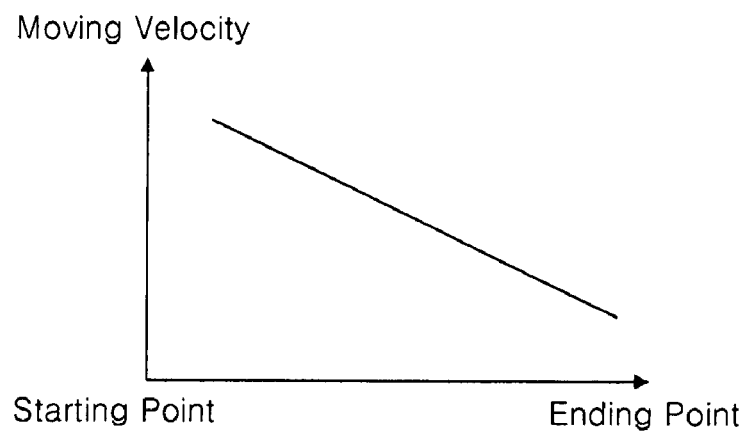
FIGS. 7 and 8 are graphs showing an exemplary embodiment of a moving velocity control method of a pressure roller in accordance with the present invention.
Figure 8:
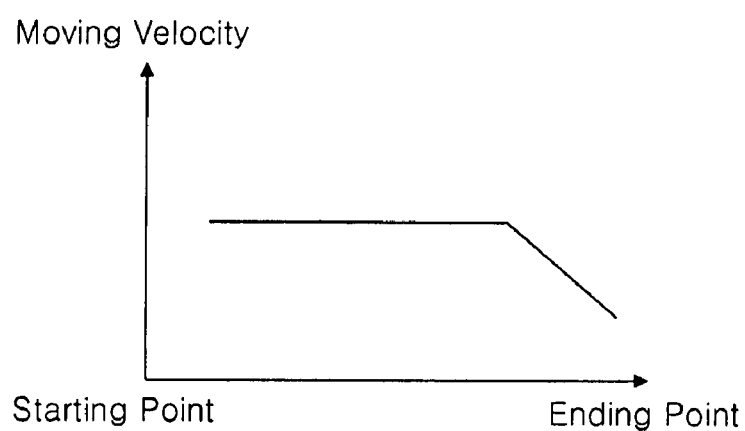

The method of changing the moving velocity of the pressure roller 40 will be described below. As shown in FIG. 7, the moving velocity is gradually reduced from the pressure-starting point to the pressure-ending point as the pressure roller 40 moves. Since the thickness of the residual film becomes smaller according to the moving velocity of the pressure roller 40, the moving velocity is reduced as it goes from the pressure-starting point to the pressure-ending point where the thickness of the residual film becomes larger. As shown in FIG. 8, according to another exemplary embodiment, the pressure roller 40 moves at a constant moving velocity and then the moving velocity is reduced as it goes to the pressure-ending point. Since there is no difference in the thickness of the residual film from the pressure-starting point to a specified middle point, the moving velocity is reduced from the specified middle point where a large difference in the thickness of the residual film occurs.

Figure 9:
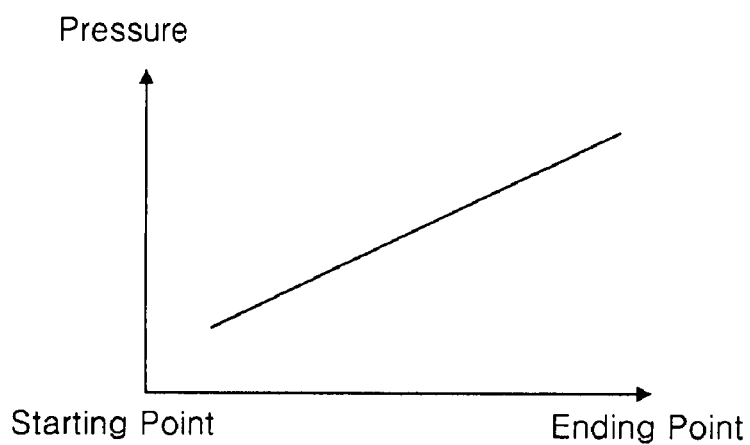
FIGS. 9 and 10 are graphs showing an exemplary embodiment of a pressure control method of a pressure roller in accordance with the present invention.
Figure 10:
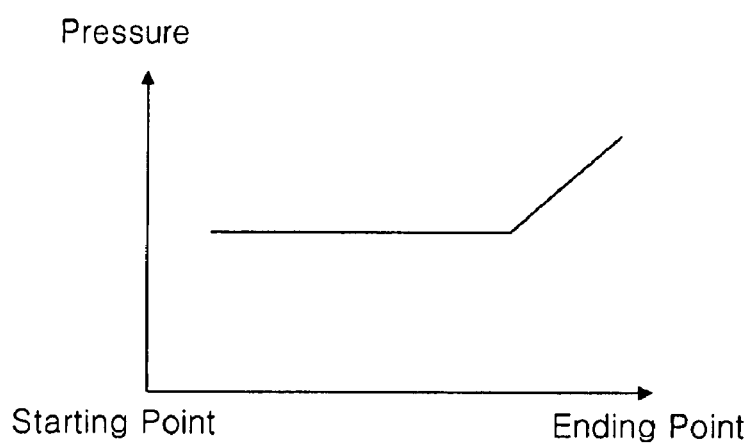

Next, the method of changing the pressure which the pressure roller 40 applies to the imprint mold 20 will be described below. As shown in FIG. 9, the pressure is gradually increased from the pressure-starting point to the pressure-ending point as the pressure roller 40 moves. Since the thickness of the residual film becomes smaller according to the pressure of the pressure roller 40, the pressure is increased as it goes to the pressure-ending point where the thickness of the residual film becomes larger. As shown in FIG. 10, it is possible for the pressure to be maintained at a constant level and then increased as it goes to the pressure-ending point.

According to another exemplary embodiment, it is possible to pressurize a whole surface of the imprint mold 20 at a same time, without using the pressure roller 40. In this case, the whole surface of the imprint mold 20 is uniformly pressurized using a pressure unit including an area equal to or larger than that of the imprint mold 20.

Figure 6A:
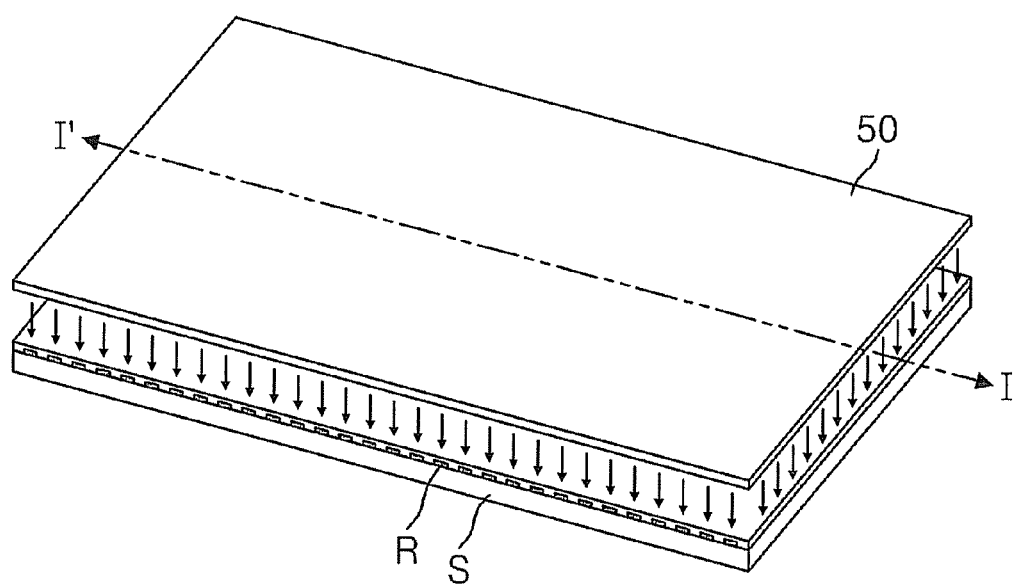
Figure 6B:
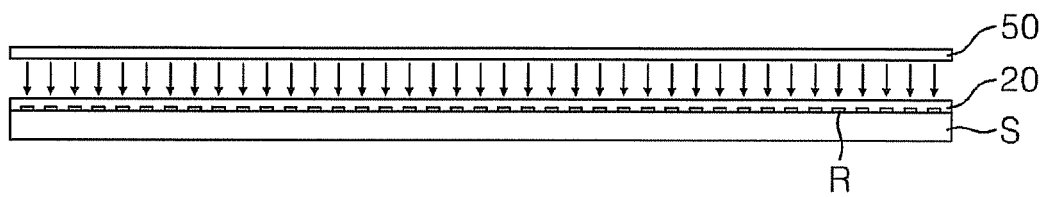

Referring back to FIG. 6A and 6B, the imprint resin R pressurized by the imprint mold 20 is cured. According to an exemplary embodiment, when the imprint resin R is an ultraviolet ray curing resin, the imprint resin R is cured by irradiating ultraviolet rays dispersed from the ultraviolet ray irradiating unit 50 as shown in FIGS. 6A and 6B. According to an exemplary embodiment, when the imprint resin R is a thermosetting resin, the imprint resin R is cured by applying heat to the substrate S.

Next, the moving velocity and the pressure of the pressure roller 40 which maintains the uniformity of the residual film will be described with reference to various experimental examples 1 through 6 and FIGS. 11 through 25.

In experimental examples 1 through 6 described below, the thickness of the residual film was measured by changing the experimental conditions such as the coating rotation speed, and the moving velocity and pressure of the pressure roller 40. The thickness of the residual film was measured at 27 points in various areas. The measurement results are as follows.

In experimental example 1, the imprint mold 20 was coated at a coating rotation speed of approximately 500 rpm and the thickness of the residual film was measured by changing the moving velocity of the pressure roller 40 at the same pressure. The results are shown in FIGS. 11 through 13.

Figure 11:
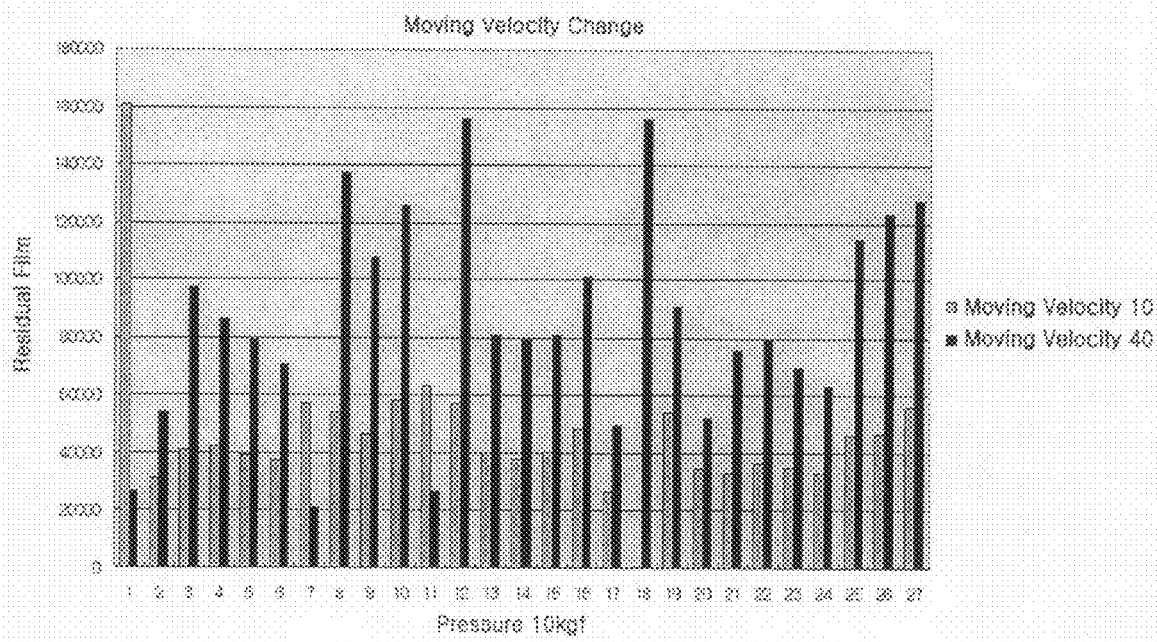
Figure 12:
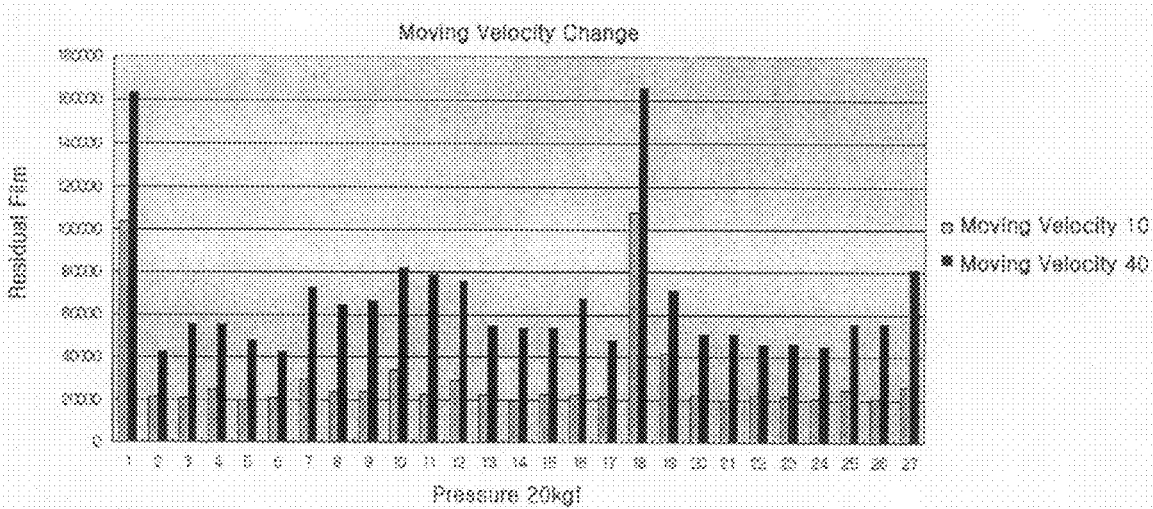
Figure 13:
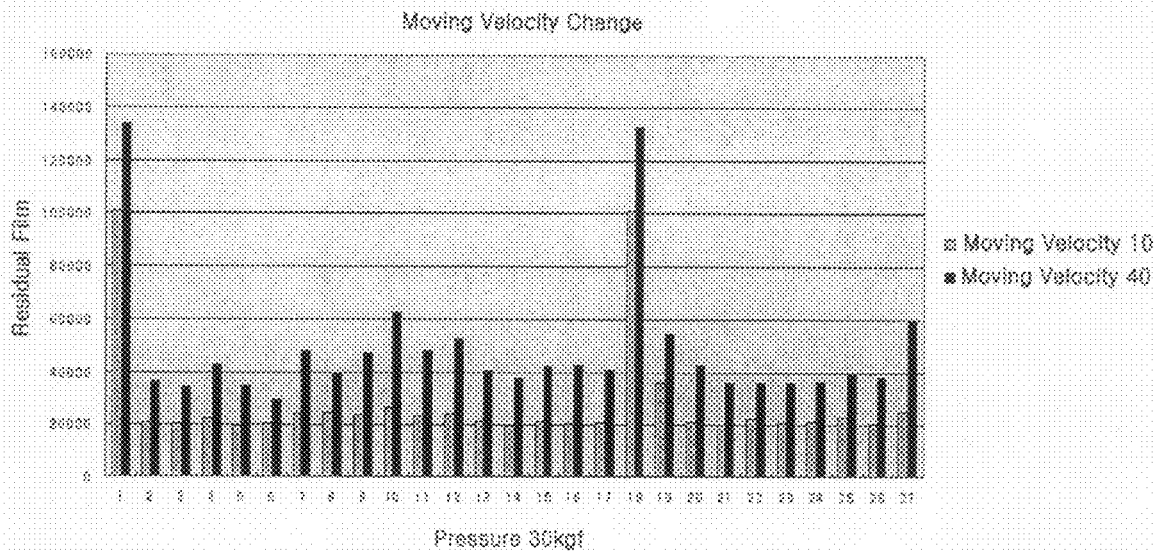

As shown in FIGS. 11 through 13, it can be seen that a more uniform thickness of the residual film was obtained as the moving velocity of the pressure roller 40 was reduced while maintaining the same pressure. However, some portions having relatively large thicknesses compared with the other portions were shown in the middle of the graphs.

In experimental example 2, the imprint mold 20 was coated at a coating rotation speed of approximately 500 rpm and the thickness of the residual film was measured by changing the pressure while maintaining the same moving velocity. The results are shown in FIGS. 14 and 15.

Figure 14:
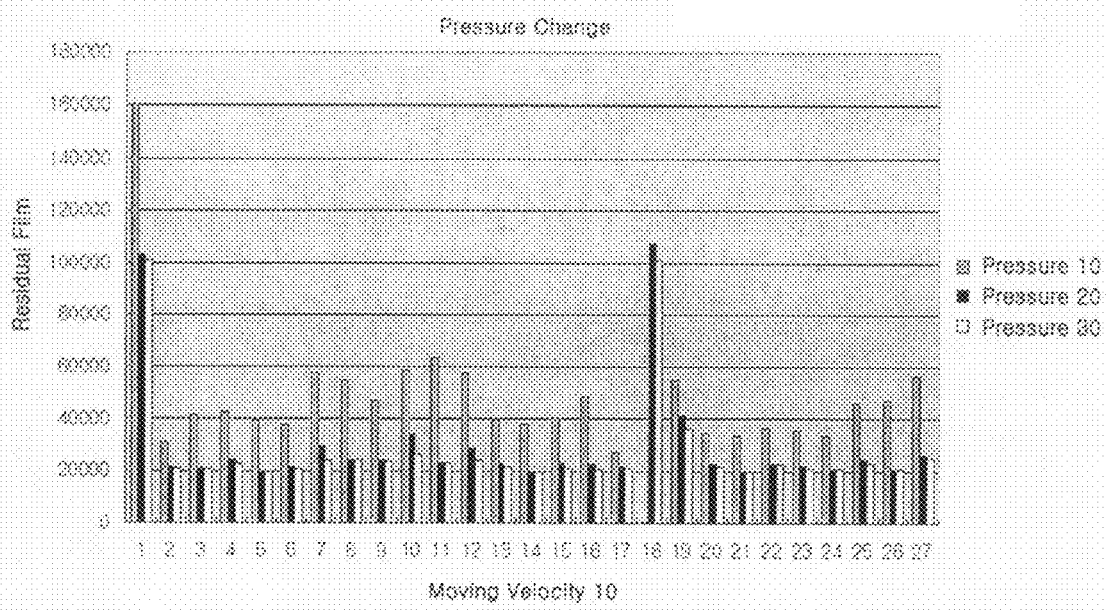
Figure 15:
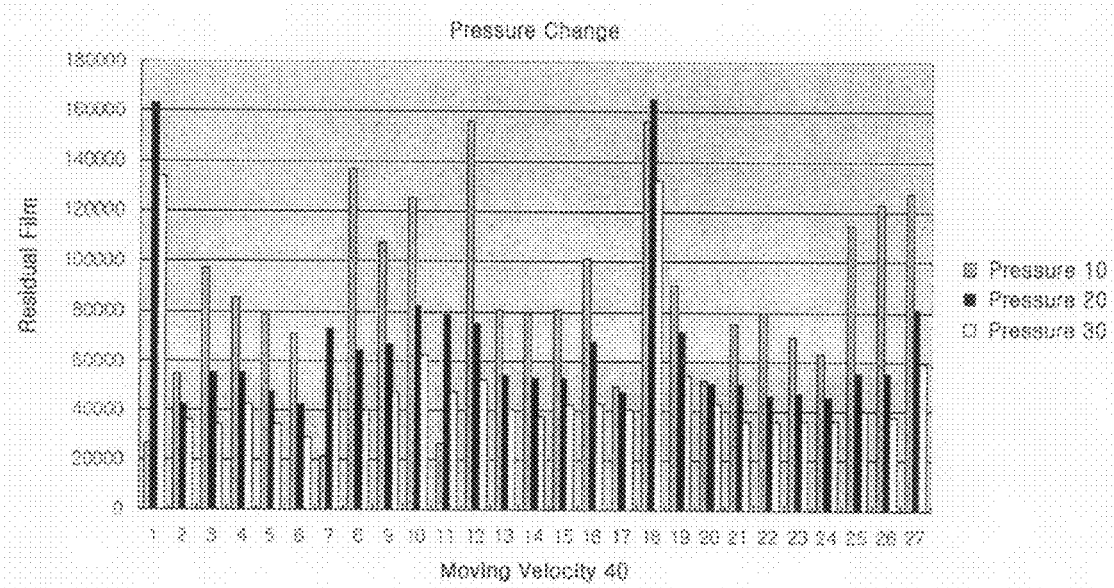

As shown in FIGS. 14 and 15, it can be seen that a more uniform thickness of the residual film was achieved as the pressure applied to the imprint mold 20 was increased while maintaining the same moving velocity. However, some portions having relatively large thicknesses compared with the other portions were shown in the middle of the graphs.

In experimental example 3, the imprint mold 20 was coated at a coating rotation speed of approximately 800 rpm and the thickness of the residual film was measured by changing the moving velocity of the pressure roller 40 while maintaining the same pressure. The results are shown in FIGS. 16 through 18.

Figure 16:
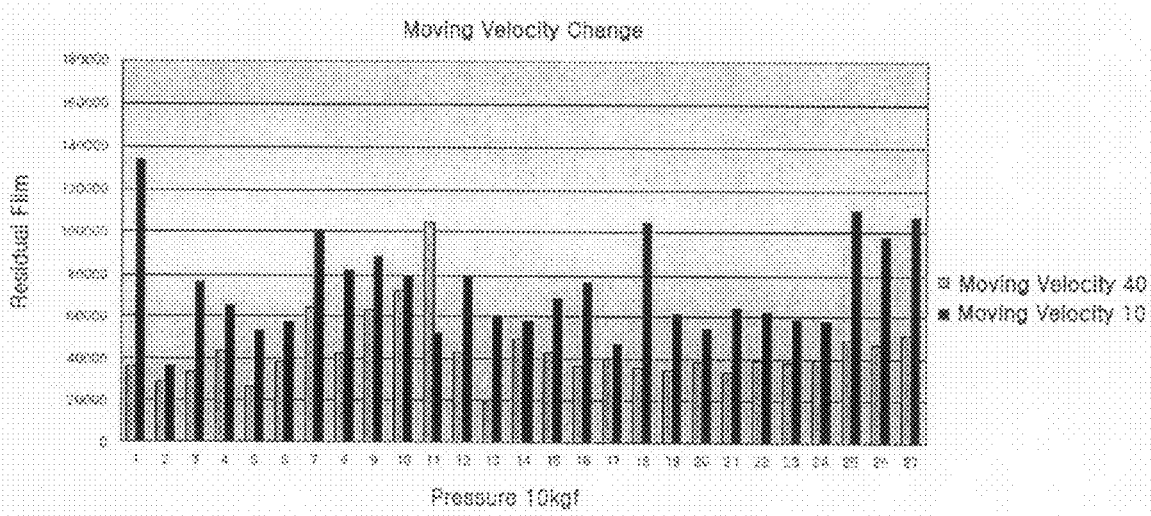
Figure 17:
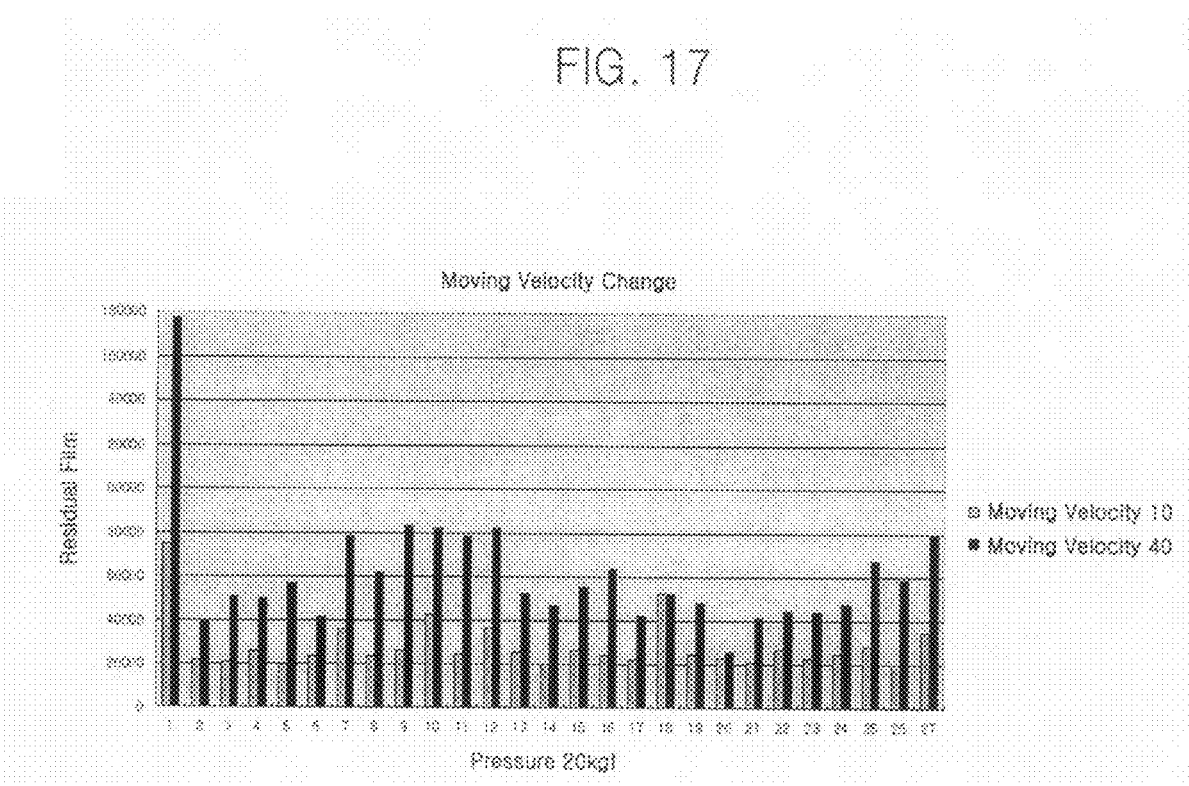
Figure 18:
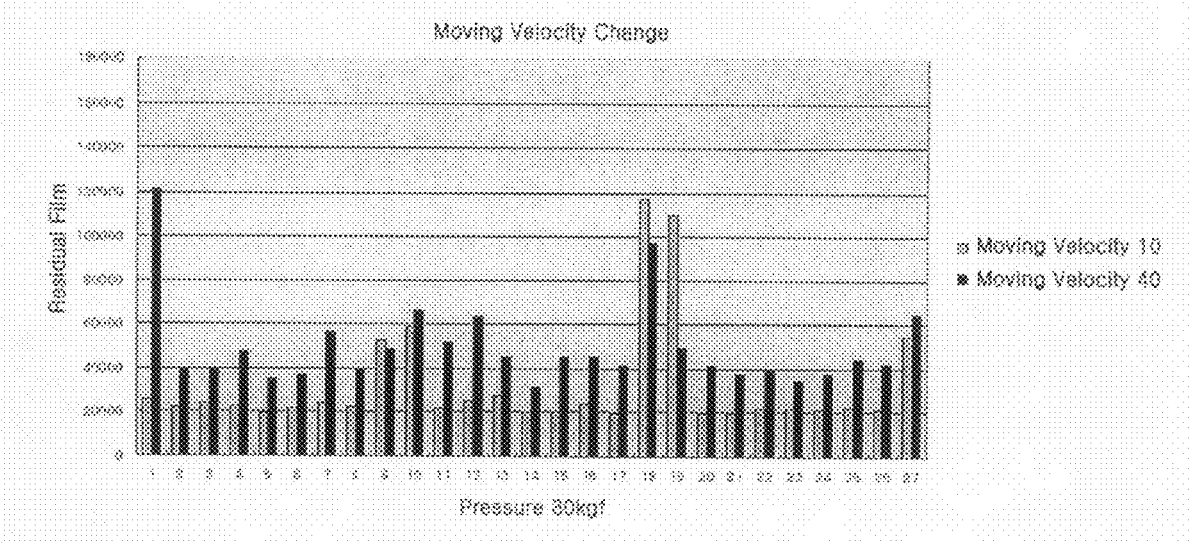

As shown in FIGS. 16 through 18, it can be seen that a more uniform thickness of the residual film was formed on the whole surface of the substrate S as the moving velocity of the pressure roller 40 was reduced while maintaining the same pressure. However, some portions having relatively large thicknesses compared with the other portions were shown in the middle of the graphs.

In experimental example 4, the imprint mold 20 was coated at a coating rotation speed of approximately 800 rpm and the thickness of the residual film was measured by changing the pressure while maintaining the same moving velocity. The results are shown in FIGS. 19 and 20.

Figure 19:
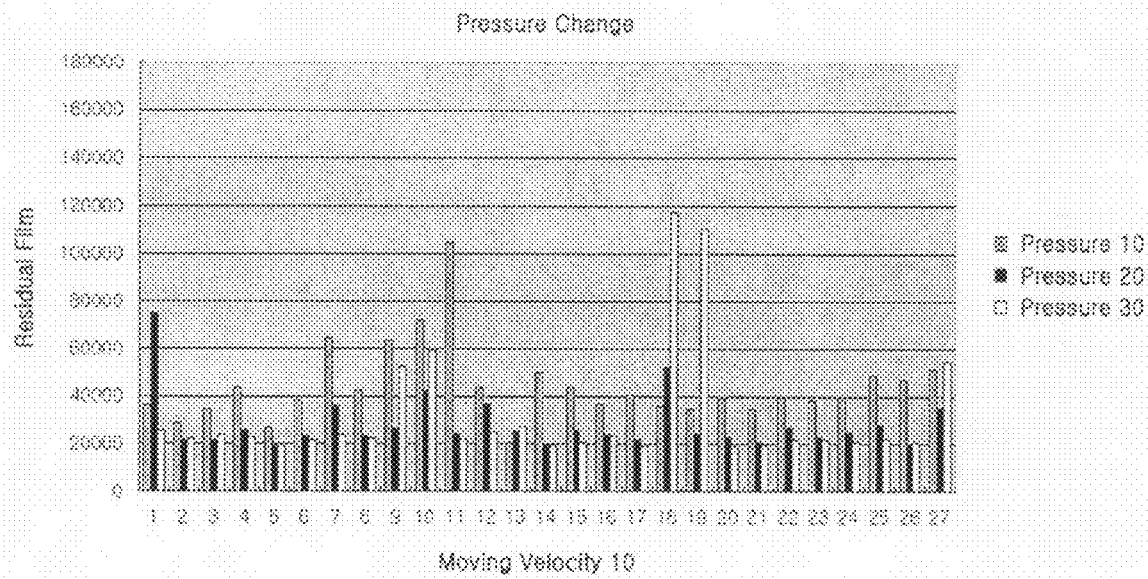
Figure 20:
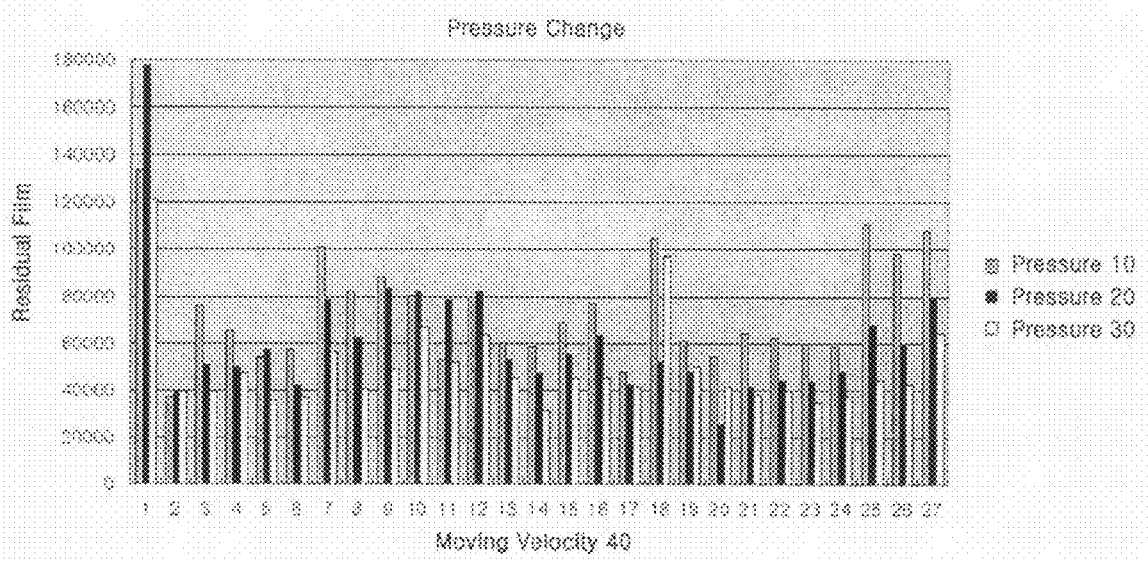

As the shown in FIGS. 19 and 20, it can be seen that a more uniform thickness of the residual film was achieved as the pressure applied to the imprint mold 20 was increased while maintaining the same moving velocity. However, some portions having relatively large thicknesses compared with the other portions were shown in the middle of the graphs.

In experimental example 5, the imprint mold was coated at a coating rotation speed of approximately 1000 rpm and the thickness of the residual film was measured by changing the moving velocity of the pressure roller 40 while maintaining the same pressure. The results are shown in FIGS. 21 through 23.

Figure 21:
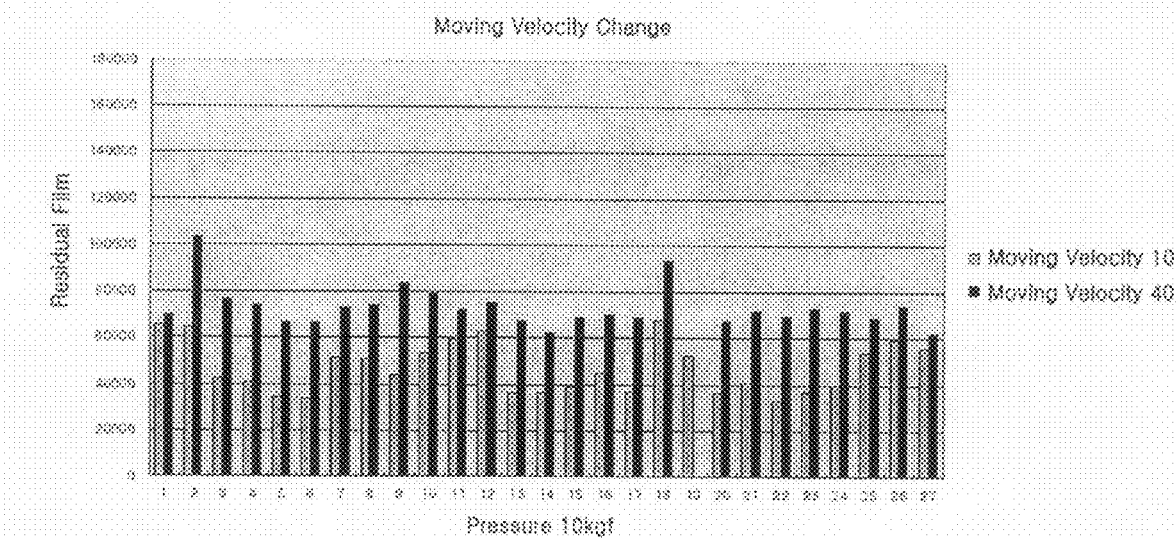
Figure 22:
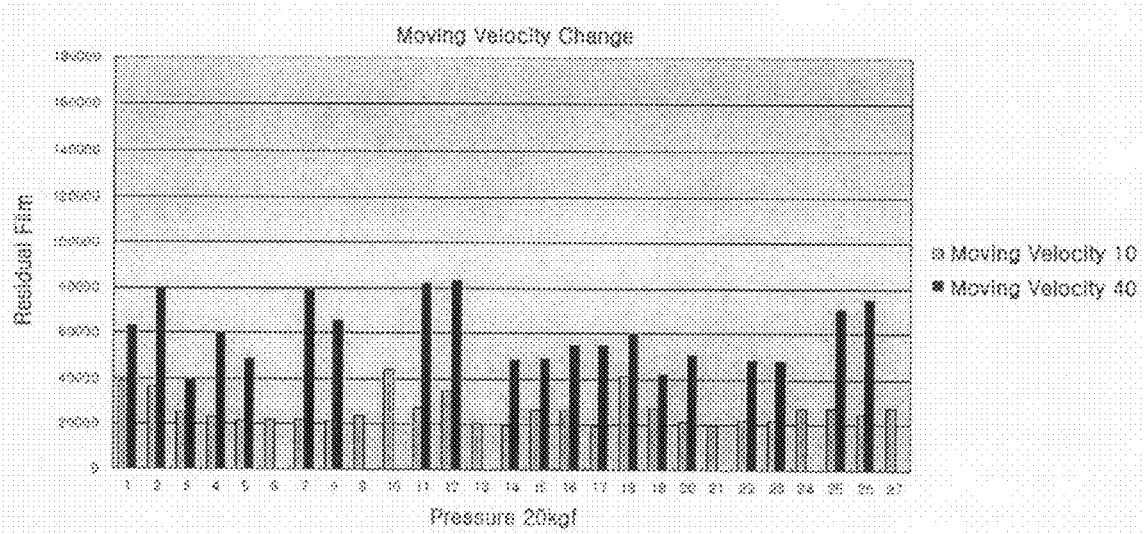
Figure 23:
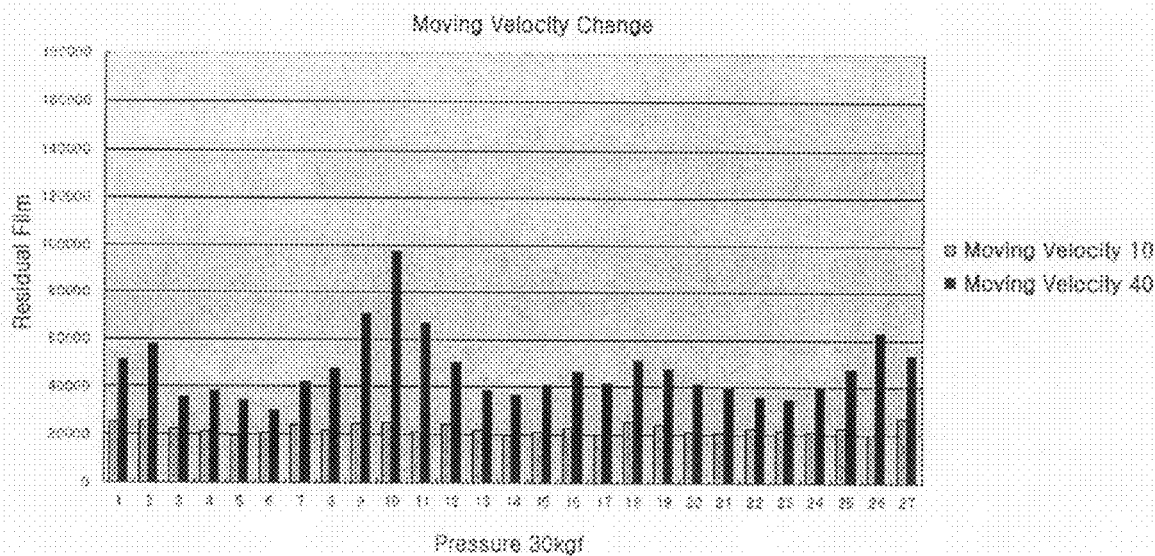

As shown in FIGS. 21 through 23, it can be seen that a more uniform thickness of the residual film was formed on the whole surface of the substrate S as the moving velocity of the pressure roller 40 was reduced while maintaining the same pressure. However, there was no portion having a relatively large thickness compared with the other portions in the middle of the graphs, differently from those results where the coating rotation speed was approximately 500 or 800.

In the experimental example 6, the imprint mold 20 was coated at a coating rotation speed of approximately 1000 rpm and the thickness of the residual film was measured by changing the pressure while maintaining the same moving velocity. The results are shown in FIGS. 24 and 25.

Figure 24:
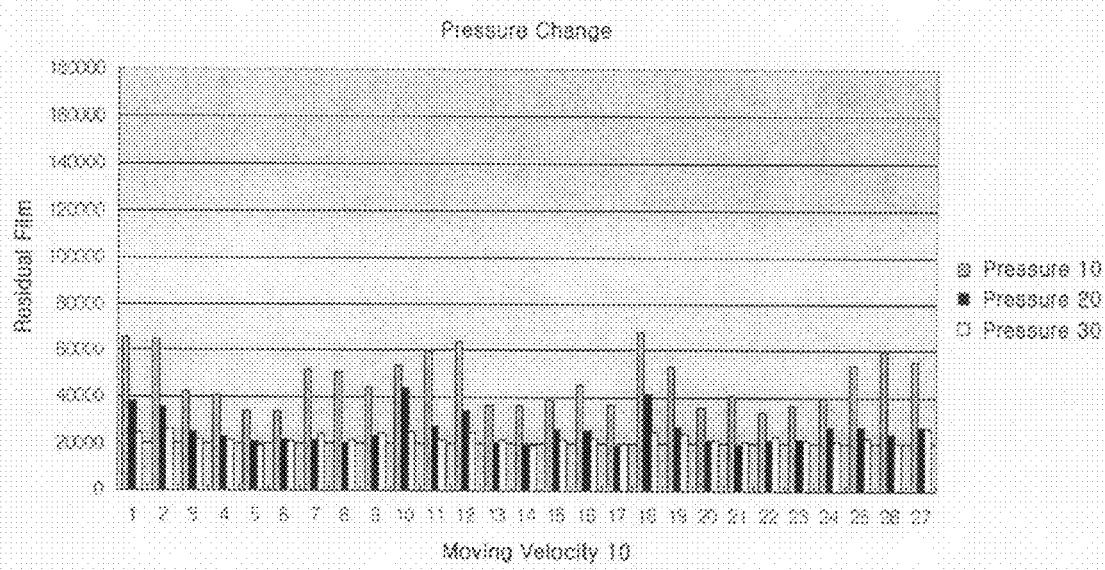

As shown in FIGS. 24 and 25, it can be seen that a more uniform thickness of the residual film was achieved as the pressure applied to the imprint mold 20 was increased while maintaining the same moving velocity. However, there was no portion having a relatively large thickness compared with the other portions in the middle of the graphs, differently from those where the coating rotation speed was approximately 500 or 800.

As a result, it can be understood that the uniformity of the residual film was greater under the conditions where the moving velocity was reduced as the pressure was increased. Moreover, it can be ascertained that a portion having a relatively large thickness was not shown in any position of the substrate in the case where the coating rotation speed was approximately 1000 rpm. It is believed that the reason for this is that the amount of the coated imprint resin R was small due to the reduced processing time from the coating to the imprinting or due to the high rotation speed.

As described above, the imprinting apparatus 1 and method in accordance with exemplary embodiments of the present invention form a residual film having a uniform thickness by changing the moving velocity and the pressure of the pressure roller 40 which pressurizes the imprint mold 20 from the pressure-starting point to the pressure-ending point.

While the present invention has been shown and described with reference to some exemplary embodiments thereof, it should be understood by those of ordinary skill in the art that a various changes in form and detail may be made therein without departing from the spirit or scope of the present invention as defined in the appended claims.

What is claimed is:

1. An imprinting method comprising:
    coating an imprint resin on a substrate;
    aligning an imprint mold on the imprint resin;
    pressurizing the imprint mold by changing a moving velocity and an applied pressure of a pressure roller according to a position of the imprint mold; and
    curing the imprint resin,
    wherein pressurizing the imprint mold further comprises pressurizing the imprint mold by reducing the moving velocity of the pressure roller as the pressure roller goes from a pressure-starting point to a pressure-ending point.

2. An imprinting method comprising:
    coating an imprint resin on a substrate;
    aligning an imprint mold on the imprint resin;
    pressurizing the imprint mold by changing a moving velocity and an applied pressure of a pressure roller according to a position of the imprint mold; and
    curing the imprint resin,
    wherein pressurizing the imprint mold further comprises pressurizing the imprint mold by moving the pressure roller at a constant moving velocity from a pressure-starting point to a specified middle point and then reducing the moving velocity after the pressure roller passes the specified middle point to a pressure-ending point.

3. An imprinting method comprising:
    coating an imprint resin on a substrate;
    aligning an imprint mold on the imprint resin;
    pressurizing the imprint mold by changing a moving velocity and an applied pressure of a pressure roller according to a position of the imprint mold; and
    curing the imprint resin
    wherein pressurizing the imprint mold further comprises pressurizing the imprint mold by increasing the applied pressure of the pressure roller as the pressure roller goes from a pressure-starting point to a pressure-ending point.

4. The imprinting method of claim 1, wherein pressurizing the imprint mold further comprises increasing the applied pressure of the pressure roller as the pressure roller goes from the pressure-starting point to the pressure-ending point.

5. The imprinting method of claim 1, wherein coating the imprint resin on the substrate comprises coating the imprint resin by performing a spin coating method.

6. The imprinting method of claim 5, wherein coating the imprint resin further comprises coating the imprint resin at a coating rotation speed of more than approximately 1000 rpm.

7. The imprinting method of claim 1, wherein aligning the imprint mold comprises:
   adjusting a position of the imprint mold relative to the position of the substrate; and
   tilting one side of the imprint mold to come into contact with the substrate.

8. The imprinting method of claim 7, wherein pressurizing the imprint mold comprises sequentially pressurizing the imprint mold by moving the pressure roller from a portion of the imprint mold coming in contact with the substrate in an opposite direction.

9. The imprinting method of claim 1, wherein curing the imprint resin comprises curing the imprint resin by irradiating ultraviolet rays to the imprint resin.

* * * * *